United States Patent

Tanaka et al.

[11] Patent Number: 5,899,708
[45] Date of Patent: May 4, 1999

[54] METHOD FOR FORMING A THIN FILM TRANSISTOR USING AN ELECTROSTATIC SHIELD

[75] Inventors: Nobuhiro Tanaka; Takeshi Fukunaga, both of Kanagawa, Japan

[73] Assignee: Semiconductor Energy Laboratory Co., Ltd., Kanagawa-ken, Japan

[21] Appl. No.: 08/872,781

[22] Filed: Jun. 10, 1997

[30] Foreign Application Priority Data

Jun. 11, 1996 [JP] Japan ................................. 8-171884

[51] Int. Cl.⁶ ............................. H01L 21/00; H01L 23/60
[52] U.S. Cl. ........................ 438/149; 438/151; 438/928
[58] Field of Search .................................... 438/476, 928, 438/14, 33, 151, 149, FOR 155, FOR 183, FOR 184, FOR 200, FOR 201, 458, 459, 460, 464; 257/355

[56] References Cited

U.S. PATENT DOCUMENTS

| | | | |
|---|---|---|---|
| 4,608,095 | 8/1986 | Hill | 438/476 |
| 4,608,096 | 8/1986 | Hill | 438/476 |
| 4,824,698 | 4/1989 | Jastrzebski et al. | 438/476 |
| 5,189,508 | 2/1993 | Tachimori et al. | 438/476 |
| 5,219,771 | 6/1993 | Miyake . | |
| 5,360,748 | 11/1994 | Nadahara et al. | 438/476 |
| 5,374,842 | 12/1994 | Kusakabe | 438/476 |
| 5,397,903 | 3/1995 | Hirose | 438/476 |
| 5,419,786 | 5/1995 | Kokawa et al. | 438/476 |
| 5,443,661 | 8/1995 | Oguro et al. | 438/476 |
| 5,466,622 | 11/1995 | Cappelletti . | |
| 5,506,155 | 4/1996 | Kaigawa | 438/476 |
| 5,516,706 | 5/1996 | Kusakabe | 438/476 |
| 5,534,294 | 7/1996 | Kubota et al. | 438/476 |
| 5,605,602 | 2/1997 | DeBusk . | |
| 5,698,942 | 12/1997 | Greene et al. | 313/497 |
| 5,721,145 | 2/1998 | Kusakabe et al. . | |

*Primary Examiner*—Mary Wilczewski
*Attorney, Agent, or Firm*—Fish & Richardson P.C.

[57] ABSTRACT

In manufacturing a semiconductor device on a glass substrate, a conductive thin-film (for instance, a conductivity-imparted silicon film) is formed on the bottom surface side of the glass substrate at the initial stage of a manufacturing process. Since the conductive thin film serves as an electrostatic shield, the glass substrate is prevented from being electrified directly, whereby electrostatic breakdown of device elements as would otherwise be caused by electrification of the glass substrate can be avoided.

9 Claims, 3 Drawing Sheets

IMPURITY ION IMPLANTATION

IMPURITY ION IMPLANTATION

METHOD FOR FORMING A THIN FILM TRANSISTOR USING AN ELECTROSTATIC SHIELD

BACKGROUND OF THE INVENTION

1. Field of the Invention

The present invention relates to a manufacturing method of a semiconductor device having a countermeasure against static electricity. In particular, the invention relates to a manufacturing method of a semiconductor device using a thin-film semiconductor such as a thin-film transistor formed on a glass substrate.

2. Description of the Related Art

It is known that due to electrification with static electricity (contact electrification, triboelectrification, stripping electrification, or the like) a dielectric material, for instance, is given a very high voltage which amounts to several tens of kilovolts in some cases and a strong electromagnetic field is formed around it. If a conductor such as a metallic material is placed in such an environment, charge may be induced on its surface or polarity separation may occur in the inside thereof, possibly resulting in electrostatic discharge (ESD).

However, it is now pointed out that countermeasures against static electricity in semiconductor factories are insufficient, though the semiconductor industry is growing rapidly. The countermeasures against static electricity means countermeasures for preventing electrostatic breakdown of device elements due to ESD.

The causes of the above situation are the existence of still unclear problems associated with the countermeasures against static electricity and the fact that the countermeasures against static electricity require production of a large-scale facility (environment), an investment therefor would be a heavy economical burden to the management.

For the above reasons, the countermeasures against static electricity tend to be simple ones. In addition, it is said that in many cases effective measures are not taken due to insufficient knowledge of a manager of a manufacturing facility. Examples of commonly employed countermeasures against static electricity are generally classified into a method of grounding an electrified body to thereby quickly leak the charge to the ground and a method of neutralizing the charge of an electrified body with radiated ions.

For example, the method of grounding is effective in a case where an object of charge elimination is electrostatically a conductor (in general, the resistivity is less than $1.0 \times 10^6$ Ωm). The method of neutralization with plus or minus ions is effective in a case where an object is moving or is a non-conductor (in general, the resistivity is greater than $1.0 \times 10^{10}$ Ωm).

The reasons for the above facts will be described with reference to FIGS. 3A–3D. FIG. 3A shows a state that a conductor such as a metal is electrified. In this state, the density and the polarity of charge is uniform if there is no influence of an external electric field. In contrast, when a non-conductor such as glass is electrified, both of the density and the polarity is not uniform as shown in FIG. 3B. These phenomena result from high charge mobility of charge in a conductor and absence of charge mobility in a non-conductor.

Further, as shown in FIG. 3C, if an electrified conductor is grounded, it instantaneously loses its charge; that is, charge is eliminated from it. In contrast, as shown in FIG. 3D, even if a non-conductor is grounded, charge elimination takes long time or in some cases substantially no charge elimination is effected because of extremely slow movement of charge.

That is, when a non-conductor is electrified, the charge elimination by grounding is not efficient. Therefore it becomes necessary to neutralize positively electrified regions with minus ions and negatively electrified regions with plus ions.

A common neutralizing method with the use of ions is such that nitrogen molecules, for instance, included in the air are converted into plus and minus ions by changing the amount of electricity thereof by using corona discharge and ions of both polarities are uniformly dispersed in the air. An apparatus for this purpose, which is called an ionizer, is now commonly used.

In the recent semiconductor industry, the mainstream of the development is shifting from thin-film transistors (TFTs) using an amorphous silicon thin film to TFTs using a low-temperature polysilicon thin film. Accordingly, the demand for a technology for forming a semiconductor circuit on an inexpensive glass substrate is increasing further. Needless to say, a glass substrate is insulative; that is, it is a non-conductor.

In a manufacturing process of a semiconductor device, a glass substrate is electrified in various manners, i.e., by contact electrification, triboelectrification, stripping (or separation) electrification, and the like. Charge accumulated in the glass plate forms an electromagnetic field, which in turn induces charge in a conductor such as a wiring formed on the glass plate. If a sufficient amount of charge to cause ESD is induced, resulting discharge may damage device elements.

It is therefore indispensable to eliminate charge from the glass substrate. However, since it is a non-conductor, conventionally there is no effective charge elimination method other than the method of neutralizing charge with ionizer. Actually, in semiconductor device manufacturing companies, ionizers are disposed at proper locations in the entire clean room as a countermeasure against static electricity. Or each substrate is subjected to charge elimination blowing, for instance, to eliminate charge therefrom.

However, in the above methods, it is difficult to control the balance between the amounts of generated ions of both polarities. If a balance is lost, a charge elimination object may unintentionally be electrified with an excessive part of plus or minus ions.

Further, electrode needles of an ionizer for causing corona discharge are lowered in performance due to stain or deformation by galvanic corrosion. Proper maintenance management is therefore needed for the electrode needles. For this reason, at present the use of an ionizer is not a low-cost means as a permanent countermeasure against static electricity. In addition, there is a paper stating that dust that is electrostatically collected on electrode needles may become a source of dust in a clean room.

SUMMARY OF THE INVENTION

An object of the present invention is to provide a technique which enables manufacture of a semiconductor device in an environment that is given a simple countermeasure against static electricity, thereby improving the production yield.

According to one aspect of the invention, there is provided a method for forming a semiconductor device on an insulating substrate, comprising the steps of forming a conductive thin film on a bottom surface of the substrate; and causing the conductive thin film to serve as an electrostatic shield.

Examples of the conductive thin film are a thin film mainly made of a metal or a metal compound and a semiconductor thin film containing impurity ions that impart conductivity to it. In particular, where the semiconductor thin film is a silicon film, a silicon film on the top surface side (which will constitute the active layer of a thin-film transistor) and a silicon film on the bottom surface side (to be used as an electrostatic shield) can be formed at the same time. Therefore, the addition of the conductive thin film does not increase the number of film forming steps.

According to another aspect of the invention, there is provided a method for forming a semiconductor device on an insulating substrate, comprising the steps of forming a conductive thin film on each of a top surface and a bottom surface of the substrate; implanting, into the silicon film formed on the bottom surface, impurity ions that impart conductivity to the silicon film; causing the silicon film formed on the bottom surface to serve as an electrostatic shield; and removing the silicon film from the bottom surface of the substrate after completion of the semiconductor device.

The silicon films may be formed by either plasma CVD or low-pressure thermal CVD. Where low-pressure thermal CVD is employed, a silicon film that is dense and superior in adhesiveness can be formed on each of the top surface and the bottom surface of a substrate by virtue of the film forming mechanism of low-pressure thermal CVD even by a current film forming apparatus if the substrate is supported in a floating state (an elevated state). The employment of low-pressure thermal CVD is advantageous in this respect.

According to a further aspect of the invention, there is provided a semiconductor device formed on an insulating substrate, the semiconductor device comprising a conductive thin film formed on a bottom surface of the substrate and serving as an electrostatic shield.

It is desirable that the thin film serving as the electrostatic shield be a transparent conductive film which need not be removed even after completion of the semiconductor device. A typical example of the transparent conductive film is a metal compound film mainly made of an oxide of indium or tin, such as an ITO film.

FIGS. 1A–1C show an embodiment of the invention which is directed to a case of forming a thin-film transistor on a glass substrate.

In forming a silicon film which will constitute the active layer of a thin-film transistor on a glass substrate 101 having insulating surfaces, silicon films are formed on both of the top surface side and the bottom surface side of the glass substrate 101.

Then, according to the invention, impurity ions are implanted into the silicon film 103 formed on the bottom surface side to convert it into a conductivity-imparted silicon film 105, which will be used as an electrostatic shield in the following steps.

DETAILED DESCRIPTION OF THE PREFERRED EMBODIMENTS

The present invention as summarized above will be hereinafter described in detail by way of several illustrated embodiments.

Embodiment 1

This embodiment is directed to a manufacturing process in which a thin-film transistor is formed on a glass substrate by using a conductivity-imparted silicon film as a electrostatic shield. This embodiment will be described with reference to FIGS. 1A–1C.

Figure 1A:
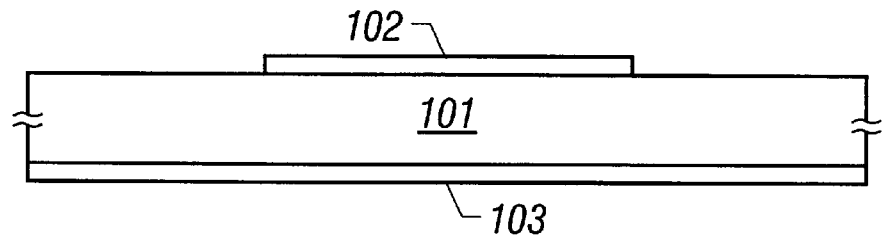
FIGS. 1A–1C show a manufacturing process of a thin-film transistor according to a first embodiment of the present invention.

Referring to FIG. 1A, reference numeral 101 denotes an insulating substrate, which is a glass substrate in this embodiment. A silicon oxide film (not shown) is formed on the glass substrate 101, and serves as a buffer layer between the glass substrate 101 and a device.

Then, a silicon film (not shown) which will constitute the active layer of a thin-film transistor is formed. The silicon film may be either an amorphous or crystalline silicon film. In this embodiment, a 1,000-Å-thick amorphous silicon film is formed by low-pressure thermal CVD.

During the film formation, the bottom surface of the substrate 101 is supported by pressure pins at the four corners. It is therefore possible to form an amorphous silicon film on each of the side and bottom surfaces with the same film quality as on the top surface.

Then, the amorphous silicon film (not shown) is converted into a crystalline silicon film. A known heating process or laser annealing process may be used as the crystallizing process. A top-surface portion of a resulting crystalline silicon film is patterned, by dry etching, into an island-like semiconductor layer 102 to become the active layer.

During the dry etching step, the silicon films on the side surfaces of the glass substrate 101 are also exposed to plasma and thereby eliminated by etching, so that a silicon film 103 remains on the bottom surface of the glass substrate 101 which is not exposed to plasma, in addition to the island-like semiconductor layer 102. Thus, the state of FIG. 1A is obtained.

Figure 1B:
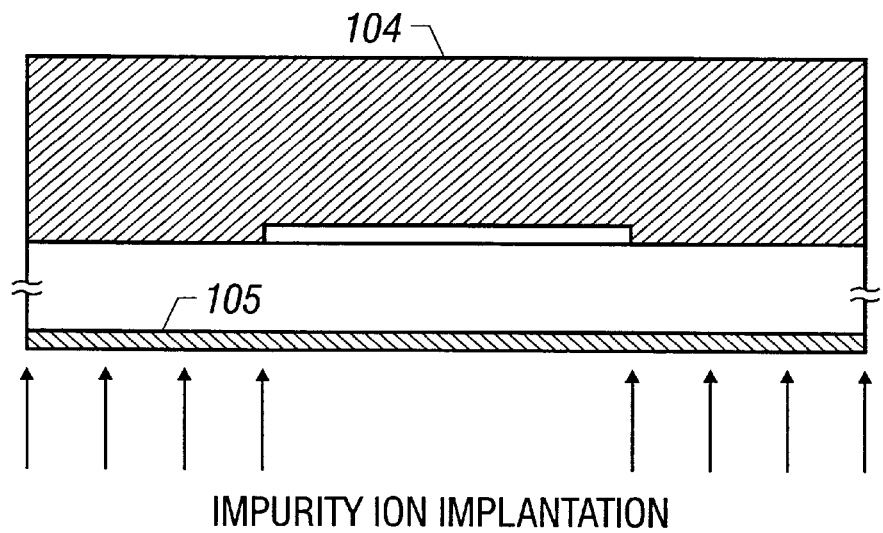

Subsequently, as shown in FIG. 1B, impurity ions (for instance, phosphorus or boron ions) for imparting one type of conductivity are implanted into the silicon film 103 remaining on the bottom surface of the glass substrate 101. During the ion implantation, the top surface side of the glass substrate 101 is protected by a resist mask 104.

Thus, a state in which the silicon film 103 is given conductivity is obtained. A conductivity-imparted silicon film 105 will serve as an electrostatic shield in the following steps.

After the state of FIG. 1B is obtained, the resist mask 104 is removed and then a gate insulating film 106, a gate electrode 107, a source region 108, a drain region 109, a channel-forming region 110, an interlayer insulating film 111, a source electrode 112, and a drain electrode 113 are formed on the top surface side of the glass substrate 101 by a known process.

Figure 1C:
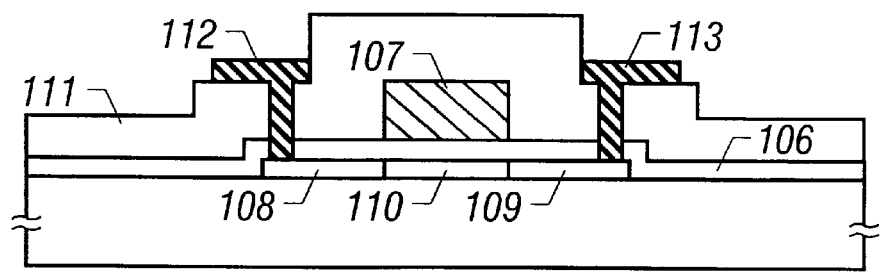

Finally, the conductivity-imparted silicon film 105 that served as the electrostatic shield is removed to complete an intended thin-film transistor having a structure shown in FIG. 1C.

Care should be taken so that the known processes employed do not include any process in which the silicon film 105 serving as the electrostatic shield is removed. In this embodiment, no process is employed in which a silicon film is etched excluding the process for forming the island-like semiconductor layer 102.

Although the above embodiment is directed to the case of forming a planar thin-film transistor having a simplest structure, it goes without saying that the invention can be applied to a thin-film transistor of any structure. The invention can therefore be practiced in a case of forming thin-film transistors for a specific purpose, for instance, forming pixel thin-film transistors or driver thin-film transistors, or reversely staggered structure thin-film transistors.

A description will be hereinafter made of how the conductivity-imparted silicon film 105 functions as the electrostatic shield in the above-described manufacturing process of a thin-film transistor. The following description is limited to a schematic one because actual behavior of static electricity is complex and is still unknown in many respects.

As described above in the prior art description, in any of such events as contact of two objects, friction between two objects, and stripping (separation) of a portion from an object, movement of charge occurs to cause static electricity. Which object is electrified with which polarity (plus or minus) is not determined unconditionally because the phenomenon of electrification depends on complicated parameters. Table 1 shows a triboelectric series indicating a tendency of electrification which commonly occurs between different objects in a semiconductor manufacturing process.

TABLE 1

| positive | air |
| --- | --- |
| | person's hand |
| | glass |
| | nylon |
| | aluminum |
| | polyester |
| | steel |
| | hard rubber |
| | nickel, copper |
| | silver |
| | brass, stainless steel |
| | acrylic |
| | polyethylene |
| | polypropylene |
| | PVC, vinyl chloride |
| | silicone |
| negative | Teflon |

A glass substrate is brought in contact with other various objects in a manufacturing process of a thin-film transistor. "Other objects" include an aluminum alloy stage of a CVD apparatus and a Teflon carrier for transporting glass substrates.

For example, with the above-mentioned combination of a glass substrate and an aluminum alloy stage, the triboelectric series suggests that the glass substrate is electrified positively and the aluminum alloy stage is electrified negatively. However, to be strict, they may be electrified in opposite ways because of complexity of the phenomenon involving various factors.

Figure 2A:
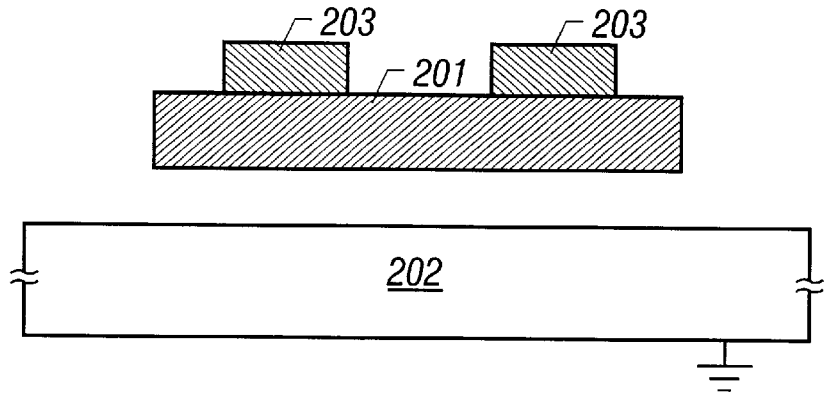
FIGS. 2A–2C illustrates an advantageous effect of an electrostatic shield.
Figure 2B:
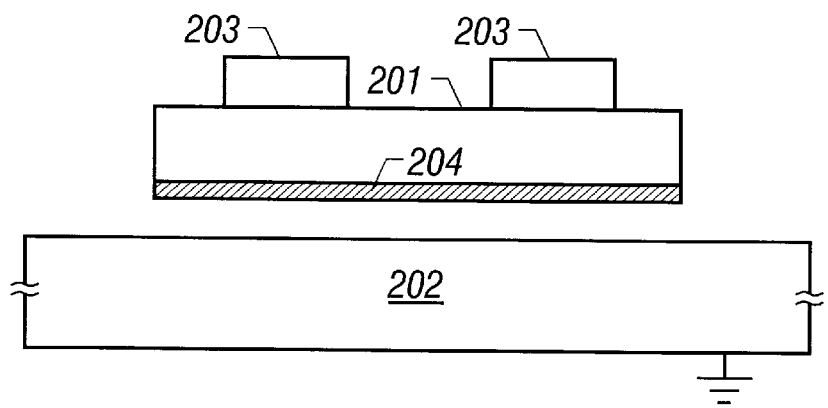
Figure 2C:
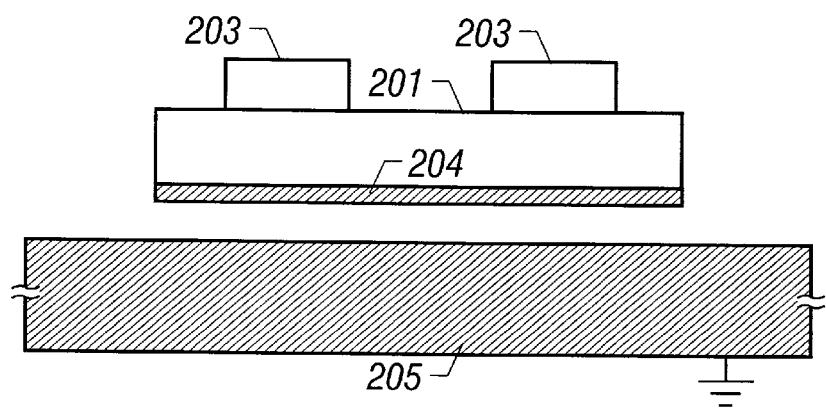

A mechanism of electrification will be described with reference to FIGS. 2A–2C. FIGS. 2A–2C show cases where two objects are contacted with each other and then separated from each other, resulting in separation electrification. In these cases, it can be considered that grounded conductor immediately lose their charge.

When a glass substrate 201 and an aluminum alloy stage 202 are separated from each other as shown in FIG. 2A, they are electrified positively or negatively by separation electrification. Since the stage 202 is grounded as shown in FIG. 2A, induced charge therein is immediately lost. However, charge induced in the glass substrate 201 remains.

Figure 3A:
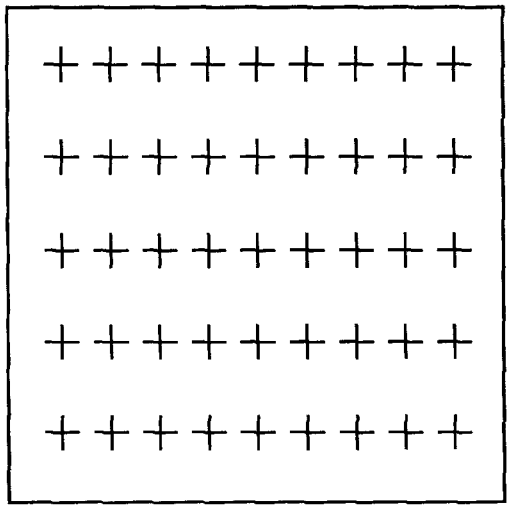
FIGS. 3A–3D illustrate electrified states of a conductor and a non-conductor.
Figure 3B:
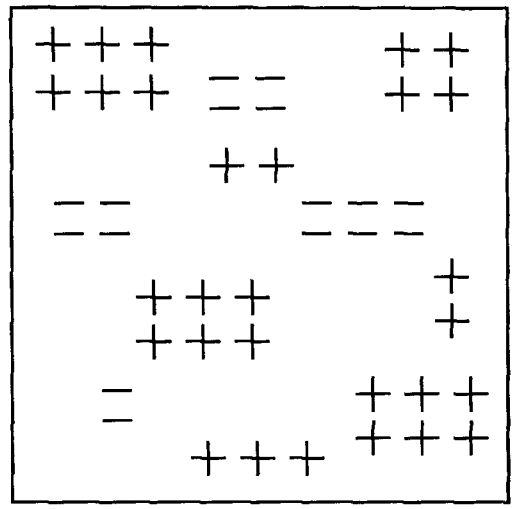
Figure 3C:
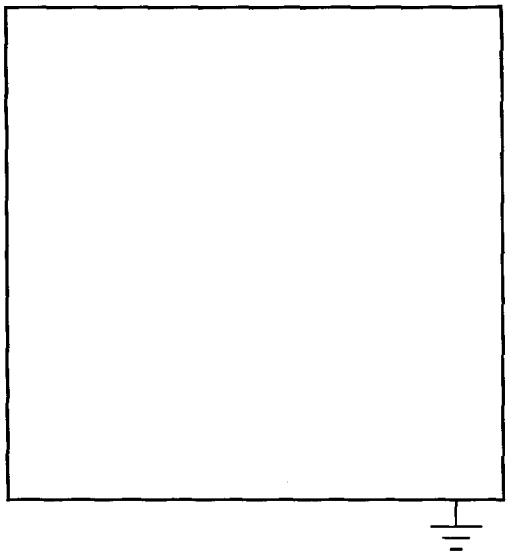
Figure 3D:
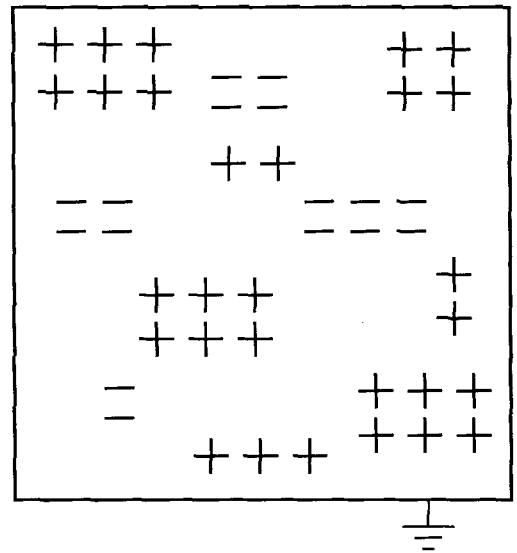

To be strict, since the glass substrate 201 is a non-conductor, the density and the polarity of charge are distributed in a complex manner in the glass substrate 201 as already explained in connection with FIG. 3B. Since charges inside an electrified body cancel out each other, it is usually considered that only the surface of the electrified body is charged. However, to simplify the drawings, an electrified body is discriminated by painting it totally.

When the glass substrate 201 is electrified, wiring lines (interconnections) formed thereon are also electrified by electrostatic induction. The amount of charge induced in the wiring lines 203 is greatly influenced by the amount of charge in the glass substrate 201.

The electrification of a glass substrate as described above occurs in many steps of a thin-film transistor manufacturing process. The strength of a resulting electromagnetic field depends on the amount of charge induced in the glass substrate. When the amount of charge induced in the wiring lines by electrostatic induction caused by the electromagnetic field exceeds a limit, the wiring lines (device elements) may be broken by discharging.

FIG. 2B shows a case where the invention is practiced. In this case, a conductivity-imparted silicon film 204 is directly contacted with an aluminum alloy stage 202. Separation electrification occurs between the silicon film 204 and the stage 202.

In this case, it is considered that while the conductivity-imparted silicon film 204 is electrified, almost no electrification occurs in the glass substrate 201. This is because when the glass substrate (to be correct, the silicon film 204) and the stage 202 are separated from each other, the silicon film 204 is usually in contact with a part of a substrate transport mechanism such as pressure pins or a transport arm and no charge accumulation occurs if the part concerned of the transport mechanism is grounded.

As shown in FIG. 2C, a non-grounded stage or a non-conductive electrode 205 having a non-conductive portion such as an electrode coated with a polymer, for instance, is permanently kept in an electrified state unless it is subjected to neutralization by ion blowing or the like.

If the invention is used in this case, a conductive silicon film 204 on the bottom surface of a glass substrate 201 serves as an electrostatic shield and can prevent electrification of the glass substrate 201. The phenomenon of electrostatic shielding means a phenomenon in which when a conductor is interposed between an electrified body and an object, no electrostatic action is exerted from the electrified body to the object. This phenomenon is well known and described in reference books etc.

As described above, according to this embodiment, the conductive silicon film 204 provided on the bottom surface of the glass substrate 201 can prevent the glass substrate 201 from being electrified directly. That is, by grounding the silicon film 204 during a step in which static electricity is generated, electrification of the glass substrate 201 can be prevented. Also in a case where the glass substrate 201 needs to be placed on an electrified body, electrification of the glass substrate 201 can be prevented because the silicon film 204 serves as an electrostatic shield.

The conventional charge elimination in which static electricity is neutralized by charge elimination blowing takes several seconds per substrate. In contrast, in the invention the charge elimination is effected during execution of an ordinary manufacturing step. The invention therefore contributes to shortening of the tact time of a step concerned.

Embodiment 2

In the first embodiment, a silicon film is also formed on the bottom surface of a glass substrate at the same time as a silicon film to constitute an active layer is formed and the former is given conductivity to use it as an electrostatic shield. Other types of conductive thin films such as a thin film mainly made of a metal or a metal compound can also serve as an electrostatic shield (second embodiment).

In this case, it is desirable that a conductive thin film to serve as an electrostatic shield in a manufacturing process of a thin-film transistor not be etched. Although the same result would be obtained by forming a conductive film that is thicker than in the ordinary case, this measure is not efficient.

The use of a material mainly made of a metal or a metal compound as an electrostatic shield as in this embodiment provides an advantage that because of large conductivity the charge elimination is effected very quickly upon grounding.

Embodiment 3

This embodiment is directed to a case where a transparent conductive film as typified by an ITO (indium tin oxide) film and a $SnO_2$ film is used as an electrostatic shield in a manufacturing process of a thin-film transistor. It is important that an etchant whose composition contains an element (particularly chlorine or the like) that etches the transparent conductive film not be used in each step.

Application of this embodiment to manufacture of a liquid crystal display that is driven by thin-film transistors formed on a glass substrate provides an advantage that a transparent conductive film need not be removed after completion of a liquid crystal display because of its transparency.

As described above, practice of the invention eliminates direct contact between a glass substrate and other objects. By providing a conductive silicon film as an electrostatic shield, electrification of the glass substrate can be prevented, whereby electrification of device elements as would otherwise be caused by electrification of the glass substrate and their electrostatic breakdown due to resulting electrostatic discharge (ESD) can be avoided.

What is claimed is:

1. A method for forming a semiconductor device on an insulating substrate, comprising the steps of:

forming a conductive thin film on a bottom surface of the insulating substrate; and removing the conductive thin film from the bottom surface of the insulating substrate after completion of forming the semiconductor device.

2. A method according to claim 1, wherein the conductive thin film is a silicon film containing impurity ions that impart conductivity to the silicon film.

3. The method of claim 1 wherein said conductive thin film comprises one of silicon, oxide of indium, oxide of tin and ITO.

4. The method of claim 1 wherein said conductive thin film has a resistivity less than $1.0 \times 10^6$ $\Omega$m.

5. The method of claim 1 wherein said conductive thin film has a resistivity greater than $1.0 \times 10^{10}$ $\Omega$m.

6. A method for forming a semiconductor device on an insulating substrate, comprising the steps of:

forming a silicon film on each of a top surface and a bottom surface of the substrate;

implanting, into the silicon film formed on the bottom surface, impurity ions that impart conductivity to the silicon film; and removing the silicon film from the bottom surface of the substrate after completion of forming the semiconductor device.

7. A method according to claim 6, wherein the silicon films are formed by low-pressure thermal CVD.

8. The method of claim 6 wherein said silicon film formed on the bottom surface has a resistivity less than $1.0\ 10^6$ $\Omega$m.

9. The method of claim 6 wherein said silicon film formed on the bottom surface has a resistivity greater than $1.0 \times 10^{10}$ $\Omega$m.

* * * * *